(12) United States Patent
Bharadwaj (10) Patent No.: US 10,475,560 B1
(45) Date of Patent: Nov. 12, 2019

(54) MAGNETIC FABRIC ITEMS (71) Applicant: Apple Inc., Cupertino, CA (US)

(72) Inventor: Shravan Bharadwaj, San Jose, CA (US)

(73) Assignee: Apple Inc., Cupertino, CA (US)

( * ) Notice: Subject to any disclaimer, the term of this patent is extended or adjusted under 35 U.S.C. 154(b) by 41 days.

(21) Appl. No.: 15/163,993

(22) Filed: May 25, 2016

Related U.S. Application Data (60) Provisional application No. 62/222,080, filed on Sep. 22, 2015.

(51) Int. Cl.
 H01F 1/03 (2006.01)
 G01R 33/12 (2006.01)
 D03D 15/00 (2006.01)

(52) U.S. Cl.
 CPC ....... H01F 1/0306 (2013.01); D03D 15/0055 (2013.01); G01R 33/1276 (2013.01)

(58) Field of Classification Search
 CPC .............. H01F 1/0306; D03D 15/0055; G01R 33/1276
 See application file for complete search history.

(56) References Cited

U.S. PATENT DOCUMENTS

| 4,435,465 | A | | 3/1984 | Ebneth et al. |
| 4,471,015 | A | | 9/1984 | Ebneth et al. |
| 5,171,419 | A | | 12/1992 | Wheeler et al. |
| 5,682,653 | A | | 11/1997 | Berglof et al. |
| 6,050,931 | A | * | 4/2000 | Russell ..................... A61N 2/06 600/15 |
| 7,696,751 | B2 | * | 4/2010 | Molyneaux .......... G01R 33/288 324/300 |
| 2002/0066585 | A1 | * | 6/2002 | Reid ................... E05B 73/0017 174/524 |
| 2003/0059609 | A1 | * | 3/2003 | Rodgers ................. D02G 3/441 428/373 |
| 2009/0309733 | A1 | * | 12/2009 | Moran ................. G06K 19/041 340/572.1 |
| 2013/0207759 | A1 | * | 8/2013 | Nakamichi ............... H01F 7/02 335/302 |
| 2015/0002256 | A1 | * | 1/2015 | Bourns ............... H01F 27/2804 336/84 M |
| 2015/0296910 | A1 | * | 10/2015 | Nelson ................... A41F 1/002 24/303 |

(Continued)

*Primary Examiner* — Akm Zakaria (74) *Attorney, Agent, or Firm* — Treyz Law Group, P.C.; G. Victor Treyz; Kendall W. Abbasi (57) ABSTRACT

Items such as electronic devices, fabric-based items, and other items may include strands of magnetic material. The magnetic material may be formed from particles of a rare-earth alloy or other magnetic materials in a binder. Strands of magnetic material may have magnetic cores surrounded by one or more additional layers such as non-magnetic layers or may have non-magnetic cores surrounded by one or more additional layers including a magnetic layer. The strands of material may be uniform along their lengths or may be segmented into non-magnetic and magnetic portions. Items may include fabric formed from intertwined strands of magnetic material. Magnetic material may interact with permanent magnets and electromagnets. Magnetic sensors may monitor for the presence of magnetic portions of a fabric or other structure.

19 Claims, 5 Drawing Sheets (56) References Cited

U.S. PATENT DOCUMENTS

| | | | |
|---|---|---|---|
| 2015/0309563 A1* | 10/2015 | Connor ................... | G06F 3/011 73/865.4 |
| 2015/0354131 A1 | 12/2015 | Haq et al. | |
| 2016/0003269 A1* | 1/2016 | Russell-Clarke ....... | A41F 1/002 24/303 |
| 2016/0044841 A1* | 2/2016 | Chamberlain ....... | A61N 1/3718 174/350 |
| 2016/0088885 A1* | 3/2016 | Campbell .............. | A41D 13/04 2/51 |

* cited by examiner

MAGNETIC FABRIC ITEMS

This application claims the benefit of provisional patent application No. 62/222,080, filed Sep. 22, 2015, which is hereby incorporated by reference herein in its entirety.

FIELD

This relates generally to magnetic materials, and more particularly, to items that include magnetic materials.

BACKGROUND

Magnetic material is used to form components such as permanent magnets. Permanent magnets may be difficult to incorporate into certain items such as fabric-based items and other items without creating undesirable visible and tactile artifacts. If care is not taken, the items into which permanent magnets and other magnetic structures are incorporated may be overly bulky, stiff, or unsightly.

SUMMARY

Items such as electronic devices, fabric-based items, and other items may include strands of magnetic material. Magnetic material may be used in forming clasps, closures for seams in fabric-based items, flaps and other structures with positions that may be sensed using magnetic sensors, and other structures.

The magnetic material in the strands of magnetic material may be formed from particles of a rare-earth alloy or other particles magnetic materials in a polymer binder. Techniques such as molding, extrusion, selective sintering, and other techniques may be used in forming the strands of magnetic material.

Strands of magnetic material may have magnetic cores surrounded by one or more additional layers such as non-magnetic layers or may have non-magnetic cores surrounded by one or more additional layers including a magnetic layer. Strands of magnetic material may be uniform along their lengths or may be segmented into non-magnetic and magnetic portions.

Items with strands of material may include fabric formed from intertwined strands of magnetic material. Magnetic material may interact with permanent magnets and electromagnets and may be sensed by magnetic sensors.

DETAILED DESCRIPTION

Magnetic material may be used in forming electronic devices, may be used in forming accessories such as covers, straps, and bags that are associated with electronic devices, may be used in forming fabric for electronic devices and accessories, may be used in forming fabric that is incorporated into seating, furniture, building structures, and other items, and/or may be used in forming other items. Configurations in which magnetic material is used in forming items based on one or more strands of magnetic material may sometime be described herein as an example. The strands of material may be monofilaments of material and/or may be multifilament strands such as strands of yarn. Strand-based items may be formed from intertwined strands such as woven strands, knitted strands, braided strands, strands that have been intertwined to form felt, or other intertwined strands (fabric, etc.).

Magnetic material may be magnetized to form permanent magnets. Permanent magnets may interact with each other. For example, permanent magnets may be arranged to attract each other or to repel each other. Electromagnets may be electrically configured to either attract or repel a permanent magnet. Unmagnetized magnetic material (e.g., ferromagnetic material or ferrimagnetic material that has not been magnetized by application of an external magnetic field to form a permanent magnet) may also interact with permanent magnets and electromagnets. For example, a permanent magnet may attract a fabric or other structure formed from strands of unmagnetized magnetic material based on a rare earth alloy such as a neodymium alloy (e.g., NdFeB).

Figure 1:
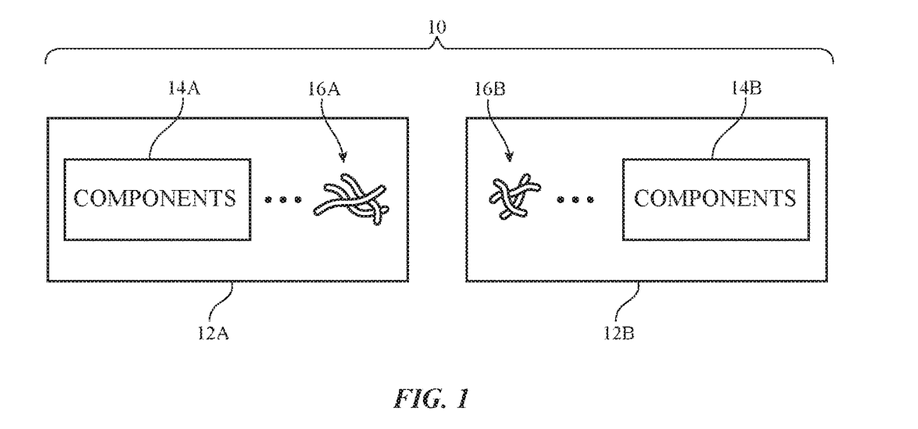
FIG. 1 is a perspective view of an illustrative system having one or more items with strands of magnetic material in accordance with an embodiment.
Figure 10:
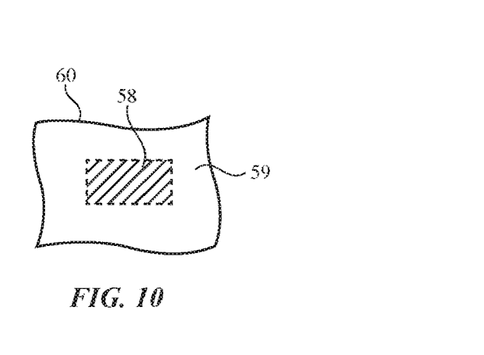
FIG. 10 is a top view of a piece of fabric having a magnetic portion in accordance with an embodiment.

An illustrative system that includes items that include magnetic structures (e.g., electromagnetics, permanent magnets, unmagnetized magnetic material, etc.) is shown in FIG. 1. As shown in FIG. 10, system 10 may include one or more items such as items 12A and 12B that include magnetic structures. Items such as items 12A and 12B may be electronic devices (e.g., cellular telephones, tablet computers, laptop computers, watches, pendant devices, other wearable devices, or other electronic equipment), may be parts of electronic devices or accessories for electronic devices (e.g., covers for portable electronic devices, straps for electronic devices, earphones, bags, covers, sleeves, or other structures that form part of electronic equipment or that are used in conjunction with electronic equipment), may be part of furniture, seating, clothing, a vehicle, a building, a kiosk, or any other items.

System 10 may include multiple parts that interact with each other (e.g., using magnetic forces). For example, system 10 may include a first item (e.g., item 12A) such as a portable electronic device and a second item (e.g., item 12B) such as a cover for the portable electronic device. In this type of scenario, items (structures) 12A and 12B are separable and are often referred to as forming different items. These components may also be used together as part of a unified system (i.e., a system formed from a device with a cover). If desired, system 10 may be a single item that is formed from multiple structures that interact with each other (e.g., using magnetic forces). For example, system 10 may be an item such as a fabric enclosure. In this type of arrangement, item 12A may form a main body portion of the enclosure and item 12B may form a flap for a pocket in the main body portion. Other configurations may also be used for system 10 (e.g., arrangements with more than three magnetically interacting items, etc.). The configuration of FIG. 1 is merely illustrative.

As shown in FIG. 1, items such as items 12A and 12B may include strands of material such as strands 16A and 16B and may therefore sometimes be referred to as forming a strand-based item or items. Strands 16A and/or 16B may include magnetic strands. For example, some or all of strands 16A and 16B may include magnetic materials such as rare-earth magnetic materials or other magnetic materials. Strands 16A and 16B may also include dielectric strands (e.g., strands formed entirely from glass, plastic, or other dielectric), conductive strands (e.g., strands with magnetic or non-magnetic metal cores or coatings), and/or strands of other materials.

If desired, items 12A and 12B may include components 14A and 14B such as permanent magnets, electromagnets, structures formed from unmagnetized magnetic material, and non-magnetic components. During operation, magnetic structures in item 12A (e.g., permanent magnets, electromagnets, structures formed from unmagnetized magnetic material, magnetic strands 16A, magnetic components 14A, and other magnetic structures) may attract, may repel, may generate a magnetic field that is sensed using a magnetic sensor, may sense a magnetic field, or may otherwise interact with magnetic structures in item 12B (e.g., permanent magnets, electromagnets, structures formed from unmagnetized magnetic material, magnetic strands 16B, magnetic components 14B, and other magnetic structures).

Figure 2:
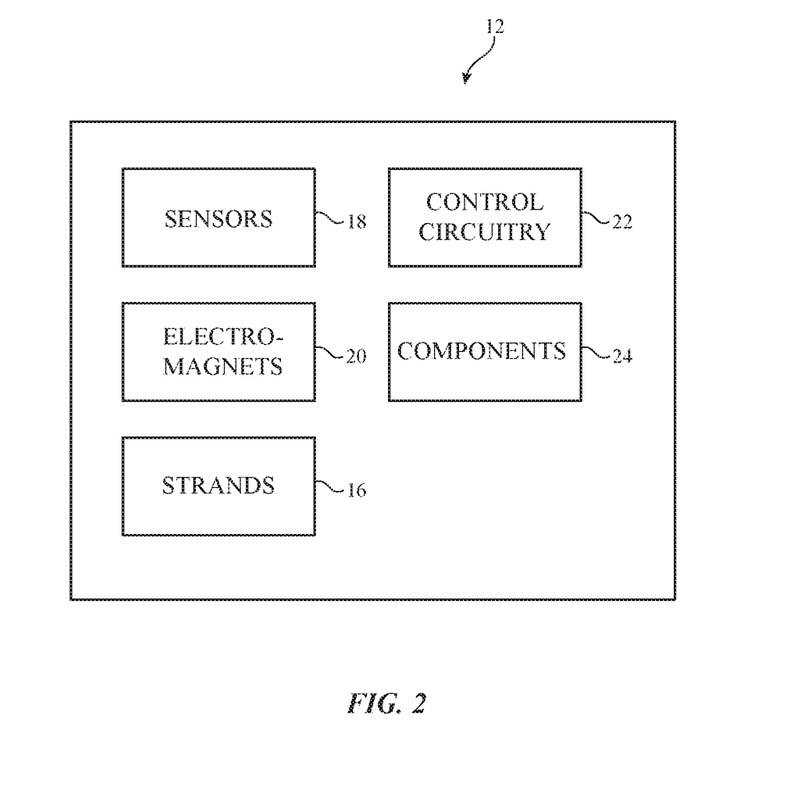
FIG. 2 is a schematic diagram of an illustrative item with strands of magnetic material in accordance with an embodiment.

FIG. 2 is a schematic diagram showing illustrative components that may be used in forming items such as item 12A and 12B of FIG. 1. As shown in FIG. 2, item 12 may include strands 16 such as strands of magnetic material and/or other material. Magnetic material may also be used to form other structures in item 12.

Item 12 may include sensors 18. Sensors 18 may include magnetic sensors (e.g., Hall effect sensors, giant magnetoresistance sensors, or other sensors that measure magnetic fields). Sensors 18 may also include light-based sensors (e.g., light-based proximity sensors that emit light and detect reflected light, ambient light sensors that detect ambient light, image sensors, etc.), microphones, accelerometers and other sensors for detecting motion and position, temperature sensors, pressure sensors, strain gauges, touch sensors, and other sensors for detecting user input and for measuring environmental conditions.

Control circuitry 22 may include microprocessors, microcontrollers, digital signal processors, volatile and non-volatile memory and other storage, application-specific integrated circuits, and other circuitry for controlling the operation of item 12. Control circuitry 22 may use information from sensors 18, and other components 24 for controlling the operation of item 12.

Electromagnets 20 may be controlled by circuitry 22 to attract or repel magnetic structures. Electromagnets 20 may, for example, be used to open and close an enclosure along a seam, may be used to secure flaps or other foldable edge structures, may be used to close and open straps, etc.

Components 24 may include input-output devices such as switches, touch screens, displays, light-emitting diodes, speakers, vibrators, haptic output devices, motors, keyboards, track pads, pointing devices, peripheral components, and other devices for gathering input from a user or the environment surrounding item 12 while supplying output (e.g., output for a user or an item associated with item 12).

All or part of the components of item 12 of FIG. 2 may be incorporated into one or more items in system 10 (see, e.g., illustrative items 12A and 12B of FIG. 1). Items such as item 12 of FIG. 2 may include one or more strands of material (see, e.g., strands 16A and 16B of FIG. 1) and may therefore sometimes be referred to as strand-based items or fabric-based items. In other situations, some or all of a given item 12 may not include strands of material. For example, a first item without strands of material may interact with a second item that includes strands of material.

Figure 3:
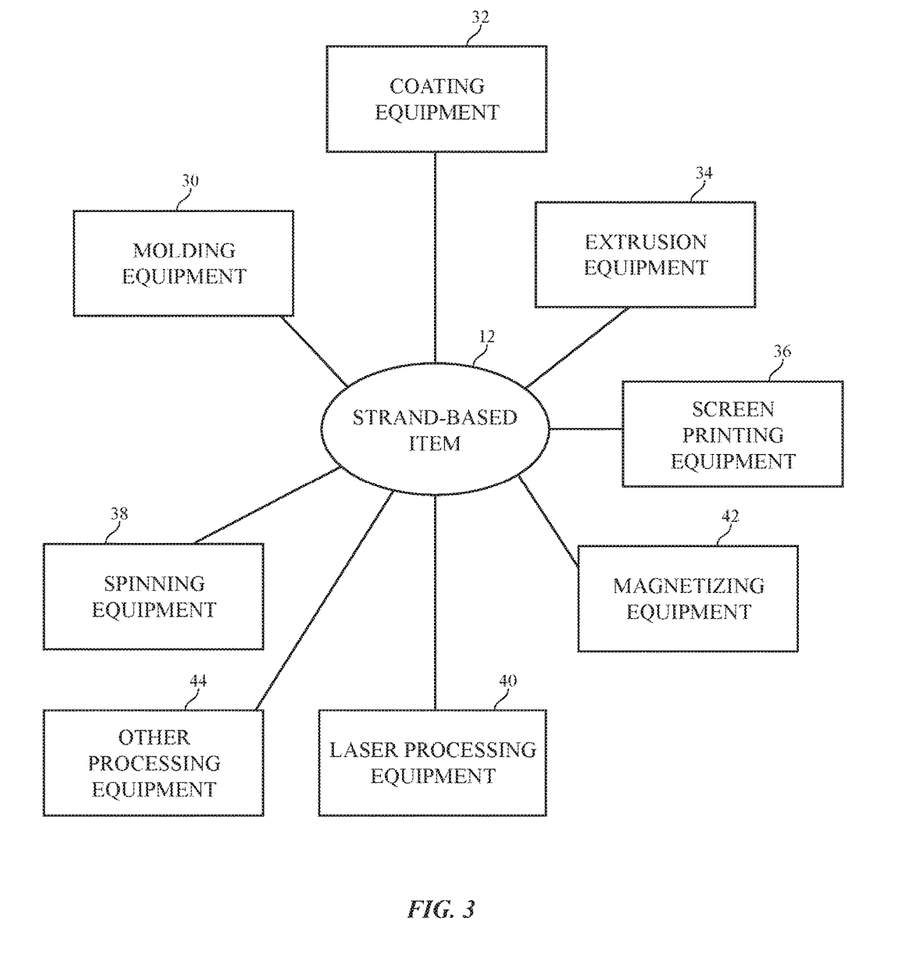
FIG. 3 is a diagram showing illustrative equipment that may be used in forming a strand-based item with strands of magnetic material in accordance with an embodiment.

Illustrative equipment that may be used in forming magnetic structures such as magnetic strands of material in item 12 or other structures is shown in FIG. 3. As shown in the example of FIG. 3, strand-based item 12 may be processed using molding equipment 30. Magnetic material may be formed from polymer binders or other binder materials containing particles of magnetic material. Molding equipment 30 may be used to mold the polymer binder and the incorporated particles of magnetic material into strands or structures with other suitable shapes. Molding equipment 30 may include a heated die that applies heat and pressure to the polymer binder and magnetic material during molding. If desired, fabric or other structures may be incorporated into a mold cavity during molding (e.g., molding equipment 30 may be injection molding equipment such as insert molding equipment). The polymer binder using in forming molded strands and other strands of magnetic material may be a thermoset polymer or a thermoplastic polymer. If desired, polymer binder with magnetic particles may be extruded to form strands of magnetic material or other structures using extrusion equipment 34. Coating equipment 32 may be used in coating strands of material (e.g., with magnetic material, dielectric material, non-magnetic conductive layers, or other layers of material).

Spinning equipment 38 (e.g., melt spinning equipment) may be used to produce ribbons of rare-earth magnetic materials or other magnetic materials. The ribbons of magnetic material from equipment 38 may be processed to form powered particle or short filaments of material that are incorporate with polymer binder or other suitable materials to form magnetic strands of material and magnetic structures of other shapes.

If desired, magnetic material such as polymer binder with magnetic particles or other magnetic material may be applied as a surface treatment or other coating to fabric (e.g., intertwined strands of material) or other structures. Screen printing equipment 36, dipping equipment, spraying equipment, or other deposition equipment (e.g., ink-jet printing equipment, pad printing equipment, etc.) may be used in applying magnetic material to some or all of a fabric in this way.

In some situations, magnetic particles can be processed to form processed regions of magnetic material structures). As an example, magnetic particles can be sintered using heat and pressure to form strands of magnetic material or magnetic material with other suitable shapes. If desired, laser processing techniques may be used to process particles of magnetic material (e.g., using laser processing equipment 40). Equipment 40 may, as an example, apply laser light to magnetic particles in strands of material, to magnetic material in a coating layer on fabric or other intertwined strands of material, or magnetic material on other structures. The applied laser light locally sinters the particles of magnetic material and forms a magnetic structure with a desired shape.

Other processing equipment such as equipment 44 may also be used in processing magnetic particles or other magnetic material to form magnetic strands, other magnetic structures, and other portions of item 12. Equipment 44 may include, for example, physical vapor deposition equipment, chemical vapor deposition equipment, electrochemical deposition equipment (e.g., tools for electroless chemical deposition and/or electroplating), etching equipment, equipment for dispensing and curing liquid polymer (e.g., liquid polymer containing magnetic material), soldering equipment, cutting tools, machining equipment, equipment for forming welds, three-dimensional printing equipment (e.g., three-dimensional printing tools or other equipment that applies light or other energy to sinter, cure, ablate, and/or otherwise adjust the properties of material associated with a 3D printing process), equipment for forming felt-like fabric from strands of material by pressing the materials together with heat and/or pressure, etc.

Magnetizing equipment 42 may be used to magnetize magnetic material. Magnetic material may be magnetized before being incorporated into fabric or other structures or may be magnetized after being incorporated into fabric or other structures. Once magnetized, the magnetic material can form a permanent magnet. The permanent magnet may be sensed by a magnetic sensor, may interact with another permanent magnet or other magnetic structure to form part of a clasp or closure, or may be used in forming other structures for item 12. With one illustrative configuration, strands of magnetic material may be woven or otherwise intertwined to form fabric. Following the formation of the fabric, magnetizing equipment such as equipment 42 (e.g., a permanent magnet or electromagnet) may apply a magnetic field that is sufficient to magnetize all of a fabric or fabric-based item, a portion of the fabric or fabric-based item, or any other portion of a strand-based item).

Figure 4:
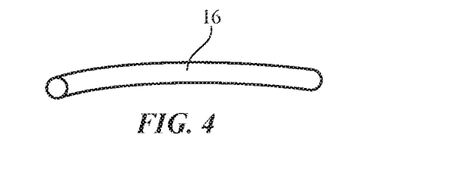
FIG. 4 is a perspective view of an illustrative uniform strand of magnetic material in accordance with an embodiment.
Figure 5:
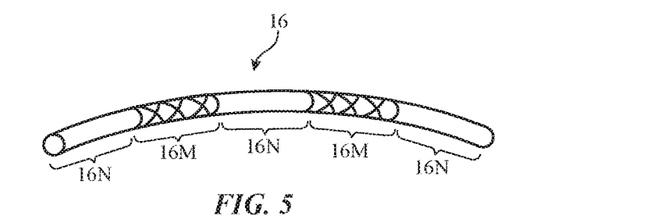
FIG. 5 is a perspective view of an illustrative segmented strand of material with magnetic and non-magnetic portions in accordance with an embodiment.

As show in FIG. 4, strands 16 may be uniform along their lengths. A fabric may contain strands that are magnetic along their entire lengths or that are non-magnetic along their entire lengths. If desired, strands 16 may have one or more segments with different properties, as illustrated by segmented strand 16 of FIG. 5. As shown in FIG. 5, strands 16 may each have segments of one type (e.g., strand segments 16N) and one or more segments of different types (see, e.g., strand segments 16M). There may be two or more different types of segments in strands 16, three or more different types of segments in strands 16, or other suitable numbers of strand segments. The configuration of FIG. 5 in which strands 16 contain two different types of segments (e.g., segments 16N and 16M) is merely illustrative. Segments 16N may be non-magnetic and segments 16N may be magnetic, segments 16N may be insulating and segments 16M may be conductive, and/or segments 16N and 16M may have other properties or combinations of properties.

Figure 6:
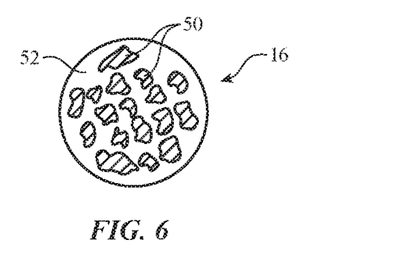
FIG. 6 is a cross-sectional side view of an illustrative strand of magnetic material formed from particles of rare-earth alloy or other magnetic material in a binder in accordance with an embodiment.

Magnetic strands may be formed using an arrangement of the type shown in FIG. 6. As shown in FIG. 6, for example, magnetic strand 16 may include particles 50 of magnetic material (e.g., neodymium alloys or other rare-earth magnetic materials, non-rare-earth ferromagnetic or ferromagnetic magnetic materials, or other magnetic particles). A polymer binder such as binder 52 (sometimes referred to as a matrix or supporting material) or other binder material may be used to support magnetic particles 50 (i.e., magnetic particles 50 may be embedded within binder 52). Examples of polymer materials that may be used to form binder 52 include polyamides (e.g., nylon 6, nylon 12, etc.) and polyphenylene sulfide (PPS). Other polymers may be used, if desired.

Figure 7:
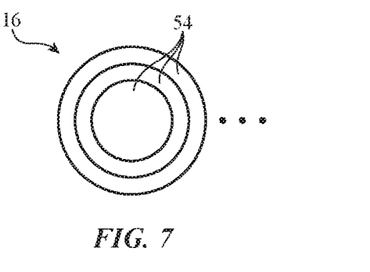
FIG. 7 is a cross-sectional side view of an illustrative strand of material having multiple layers in accordance with an embodiment.

As shown in FIG. 7, strands 16 may contain one or more layers 54 of material (e.g., a central core, an outer coating, one or more intermediate layers interposed between the coating and the core, etc.). Layers 54 may include one or more magnetic layers (e.g., layers of polymer binder containing embedded magnetic particles), may include solid magnetic alloy (e.g., rare-earth magnetic alloys such as neodymium alloys), may include dielectric (e.g., inorganic dielectric such as glass, oxides, nitrides, oxynitrides, etc.), organic dielectric such as polymers, ceramic, and/or other dielectric material, may include metal (e.g., non-magnetic metal), or other materials. In some configurations, for example, strands 16 may contain a magnetic core coated by one or more additional layers such as an insulating coating or other non-magnetic layer(s). In other configurations, strands 16 may include a polymer core or other non-magnetic core and one or more additional layers such as a layer of magnetic material (e.g., polymer with embedded rare-earth alloy particles or other magnetic material particles). Multilayer strand structures such as the structures forming strand 16 of FIG. 7 may be used along the entire length of strands 16 (see, e.g., FIG. 4) or may be used along one or more discrete segments of strands 16 (see, e.g., FIG. 5). Monofilament strands such as strands 16 of FIGS. 4, 5, 6, and/or 7 may be intertwined along their lengths to form multifilament strands (i.e., yarn).

Figure 8:
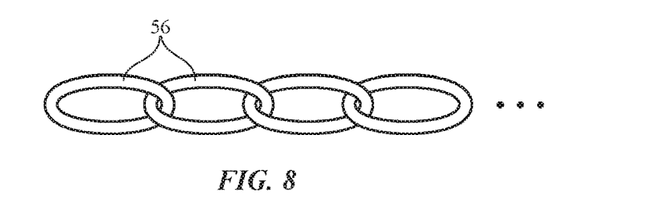
FIG. 8 is a perspective view of an illustrative items formed from links of magnetic material in accordance with an embodiment.

FIG. 8 shows how magnetic structures such as chain links 56 may be formed from magnetic material. Structures such as links 56 of FIG. 8 may be formed using three-dimensional patterning techniques. The magnetic material forming links 56 may be patterned using three-dimensional laser sintering, three-dimensional polymer binder curing techniques using laser light, or other three-dimensional printing techniques (as examples).

Figure 9:
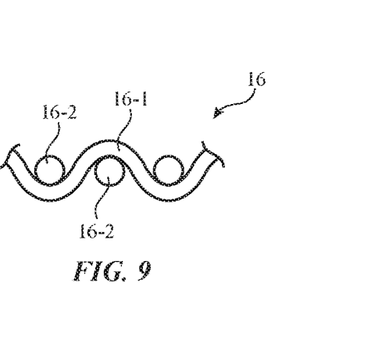
FIG. 9 is a cross-sectional side view of illustrative woven fabric having strands of magnetic material in accordance with an embodiment.

FIG. 9 shows how strands 16 may be intertwined to form fabric using weaving techniques (e.g., techniques in which weft strands 16-1 are woven with warp strands 16-2 to form a layer of fabric). The fabric may be formed using any suitable fabric construction (e.g., a plain weave, a basket weave, a twill weave, a multilayer fabric construction, etc.). Some or all of the regions of fabric that are formed in this way may be exclusively formed from strands of magnetic material and/or some or all of a fabric may be formed from non-magnetic material. Strands 16 of magnetic material may also be interwoven with strands of non-magnetic material in some or all portions of a fabric.

If desired, particular discrete areas of a fabric may be magnetic. As shown in FIG. 10 for example, a structure of interest such as intertwined strands 16 or other fabric 60 may have a magnetic area 58 that is surrounded by a non-magnetic area such as area 59. Fabrics that contain smoothly graded amounts of magnetic material may also be formed.

In the example of FIG. 10, magnetic area 58 has been formed by weaving, knitting, braiding, or otherwise intertwining strands together that contain magnetic segments that overlap in area 58, may be formed by laser sintering or other processing techniques (e.g., processing arrangements in which area 58 is heated, compressed, selectively coated, or otherwise treated differently than area 59 so that a magnetic material is formed in area 58), and/or may be formed by applying a magnetizing magnetic field selectively to area 58 with magnetizing equipment 42 (FIG. 3).

Figure 11:
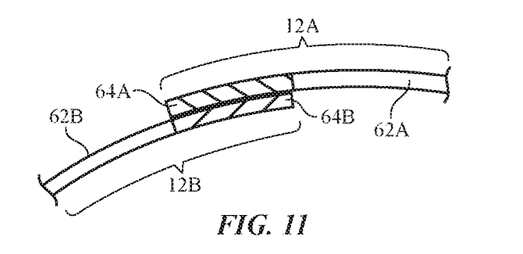
FIGS. 11, 12, and 13 are diagrams of illustrative items with magnetic portions formed from strands of magnetic material in accordance with an embodiment.
Figure 12:
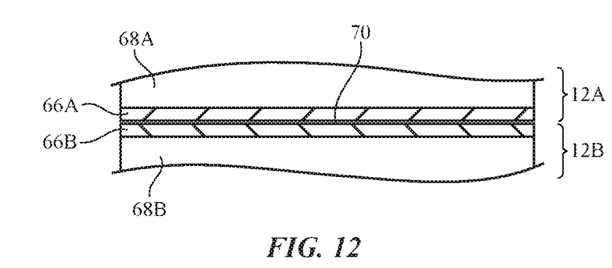
Figure 13:
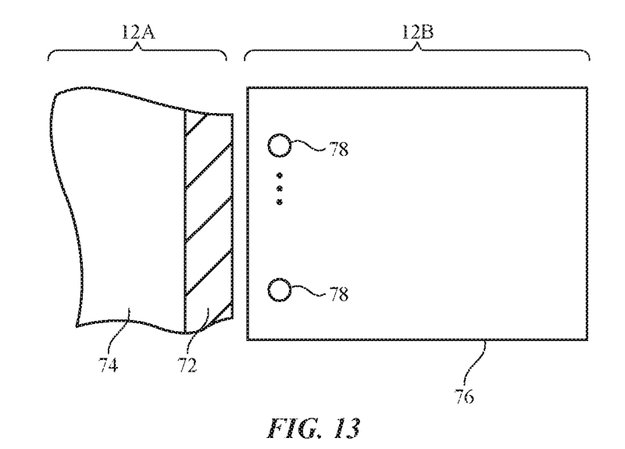

Illustrative applications of magnetic fabric or other structures formed from strands 16 or other structures formed from magnetic material are shown in FIGS. 11, 12, and 13.

In the example of FIG. 11, item 12A may be a first portion of a strap for an enclosure or electronic device and item 12B may be a second portion of the strap that overlaps the first portion. Strap portion (strap) 12A may contain non-magnetic material in region 62A and magnetic material in region 64A. Strap portion 12B may contain non-magnetic material in region 62B and magnetic material in region 64B. When worn on a user's wrist or otherwise used by a user, regions 64A and 64B may overlap as shown in FIG. 11. The strands of material in region 64A and/or 64B may be magnetized so that the portions of items 12A and 12B in regions 64A and 64B attract each other. The portions of the strap in regions 64A and 64B may therefore serve as a clasp or other interlocking structures (e.g., a clasp that holds the strap together so that the electronic device coupled to the strap stays on the user's wrist).

If desired, items 12A and 12B may form parts of a bag, cover, or item of clothing. For example, item 12B of FIG. 11 may be form the main body of a bag, cover, or piece of clotting and item 12A may be a flap, part of a pocket, an edge portion, a folding edge portion, or other portion of the bag, cover, or item of clothing that can be moved into place so that portions 64A and 64B join together (e.g., to cover and close the bag, to cover and close a pocket in a bag or item of clothing), to secure an electronic device within a cover, etc. Portions such as portions 62A and 64A of item 12A may be integral portions of a unitary piece of fabric and portions such as portions 62B and 64B may be integral portions of a unitary piece of fabric or some or all of these portions may be separate structures that are attached to each other with adhesive, fasteners, or other attachment structures.

In the illustrative configuration of FIG. 12, item 12A has a non-magnetic portion 68A and a magnetic portion 66A and item 12B has a non-magnetic portion 68B and a magnetic portion 66A. Portions 66A and 68A may be unitary portions of a single piece of fabric or may be separate structures that are attached to each other using adhesive, fasteners, or other attachment structures. Similarly, portions 66B and 68B may be unitary portions of a single piece of fabric or may be separate structures that are attached to each other using adhesive, fasteners, or other attachment structures.

As shown in FIG. 12, portions 66A and 66B may be magnetically attracted to each other and may therefore close along seam 70. Items 12A and 12B may, as an example, form portions of an enclosure (e.g., a bag or cover), an item of clothing, or other item with a pockets or other interior portion. Portions 66A and 66B may be pulled apart along seam 70 (e.g., by applying sufficient force to overcome the magnetic attraction between these portions) whenever a user desires to access the interior of the enclosure, pocket, or other interior area of the item. When it is desired to close the item along seam 70, portions 66A and 66B may be brought into close proximity to each other, at which point the magnetic attraction between portions 66A and 66B will pull them together and seal the seam. In this type of scenario, portions 66A and 66B may serve as a magnetic closure.

FIG. 13 is a diagram of an illustrative configuration for items 12A and 12B in which item 12A is formed from fabric. Items 12A and 12B may be separable components of a system or may be parts of a common item. Item 12A may include first portion 74 and second portion 72. First and second portions 74 and 72 may be formed from strands 16 (e.g., portions 74 and 72 may be formed from fabric). The fabric may be entirely magnetic or portion 72 may be formed from strands of magnetic material whereas portion 74 may be non-magnetic. Item 12B may be an electronic device that contains a housing such as housing 76 (e.g., a housing formed from plastic, metal, glass, other materials, or combinations of these material). Components 78 may be mounted in device 12B. Components 78 may include electromagnets that can be selectively activated to close a seam between items 12A and 12B or to otherwise attract portion 72 of item 12A towards body 76 of item 12B. If desired, components 78 may be configured to repel portion 72 (e.g., components 78 may be electromagnets that repel permanent magnets formed from some or all of portion 72). If desired, components 78 may include magnetic sensors. Magnetic sensors may be used to detect when items 12A and 12B have been separated. For example, item 12A may be part of a cover, enclosure, a pocket that receives device 12B, may be a flexible portion of item 12B, etc. When a user removes device 12B from item 12A (i.e., when devices 12A and 12B are moved away from each other by the user), the magnetic sensors may detect that sensors 78 are no longer in proximity of magnetic portion 72 of item 12A and can take appropriate action (e.g., the sleep/wake status of device 12B may be changed, device 12B may issue a notification for the user, charging operations may be changed, and/or other actions may be taken by item 12A and/or 12B.

If desired, the structures of FIGS. 11, 12, and 13 may be used together (e.g., magnetic structures in these examples may attract and/or repel and/or be monitored with magnetic sensors). Magnetic strands 16, other magnetic structures, and/or structures of the type shown in FIGS. 11, 12, and 13 may also be used with other structures, if desired. The configurations of items 12A and 12B of FIGS. 11, 12, and 13 are merely examples.

The foregoing is merely illustrative and various modifications can be made by those skilled in the art without departing from the scope and spirit of the described embodiments. The foregoing embodiments may be implemented individually or in any combination.

What is claimed is:

1. An item, comprising:
   a fabric having intertwined strands of material, wherein the fabric has a magnetic portion and a non-magnetic portion, wherein the intertwined strands of material include strands of magnetic material that form the magnetic portion of the fabric;
   an electronic device housing to which the fabric attaches;
   magnets in the electronic device housing that attract the magnetic portion of the fabric;
   magnetic sensors in the electronic device housing that measure a magnetic field generated by the magnetic portion of the fabric; and
   control circuitry that determines whether the fabric is attached or detached from the electronic device housing based on the magnetic field measured by the magnetic sensors.

2. The item defined in claim 1 wherein the magnetic material includes magnetic particles in a polymer binder.

3. The item defined in claim 2 wherein the magnetic particles comprise rare-earth magnetic particles.

4. The item defined in claim 3 wherein the rare-earth magnetic particles comprise neodymium alloy particles.

5. The item defined in claim 1 wherein the strands of material include at least one strand with a segment of magnetic material and a segment of non-magnetic material.

6. The item defined in claim 1 wherein the strands of material include at least one strand with a core formed from magnetic material and a layer formed from non-magnetic material.

7. The item defined in claim 6 wherein the core of magnetic material comprises particles of magnetic material in a polymer binder.

8. The item defined in claim 1 wherein the strands of material include at least one strand with a core formed from non-magnetic material and a layer formed from magnetic material.

9. The item defined in claim 8 wherein the layer formed from magnetic material comprises particles of magnetic material in a polymer binder.

10. The item defined in claim 1 wherein the fabric has an edge and wherein at least some of the magnetic portion extends along the edge.

11. The item defined in claim 1 wherein the fabric has portions that overlap and wherein at least some of the magnetic portion forms part of the portions that overlap.

12. The item defined in claim 11 wherein the portions that overlap are strap portions.

13. A method for forming fabric, comprising:
   forming strands of magnetic material, wherein forming the strands of magnetic material comprises forming a non-magnetic core surrounded by an outer magnetic layer, wherein the non-magnetic core comprises a first polymer, and wherein the outer magnetic layer comprises a second polymer having embedded particles of magnetic material;
   intertwining the strands of magnetic material to form at least a part of a bag strap; and
   after intertwining the strands of magnetic material, magnetizing a portion of the strands of magnetic material to form at least one permanent magnet in the part of the bag strap.

14. A system, comprising:
   a magnetic sensor;
   a fabric that opens and closes along a seam,
      wherein the fabric has magnetic strands of material and wherein the magnetic sensor measures a magnetic field generated by the magnetic strands of material; and
   control circuitry that determines whether the seam is open or closed based on the magnetic field measured by the magnetic sensor.

15. The system defined in claim 14 wherein the magnetic strands of material comprise polymer with embedded magnetic particles.

16. The system defined in claim 15 wherein the embedded magnetic particles comprise particles of a rare-earth alloy.

17. The system defined in claim 14 wherein the control circuitry determines a proximity of the fabric using the magnetic sensor.

18. The system defined in claim 17 wherein the control circuitry shifts the system between a wake state and a sleep state based on the proximity of the fabric.

19. The item defined in claim 1 wherein the control circuitry determines a proximity of the magnetic portion of the fabric using the magnetic sensors.

* * * * *